(12) United States Patent
Han

(10) Patent No.: US 7,618,830 B2
(45) Date of Patent: Nov. 17, 2009

(54) RAPID THERMAL PROCESSING APPARATUS AND METHODS

(75) Inventor: Jae-Won Han, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 828 days.

(21) Appl. No.: 10/869,665

(22) Filed: Jun. 16, 2004

(65) Prior Publication Data
US 2004/0255860 A1 Dec. 23, 2004

(30) Foreign Application Priority Data
Jun. 18, 2003 (KR) ........................ 10-2003-0039562

(51) Int. Cl.
*H01L 21/00* (2006.01)
(52) U.S. Cl. ............................................ 438/5; 438/14
(58) Field of Classification Search .................. 438/5, 438/14, 908
See application file for complete search history.

(56) References Cited

U.S. PATENT DOCUMENTS

| | | | | |
|---|---|---|---|---|
| 5,433,785 A | * | 7/1995 | Saito | .......................... 118/719 |
| 5,960,319 A | * | 9/1999 | Iwata et al. | .................. 438/664 |
| 6,271,549 B1 | | 8/2001 | Hamanaka | |
| 6,501,191 B2 | * | 12/2002 | Tanaka et al. | ................ 219/390 |
| 6,544,890 B2 | * | 4/2003 | Hamanaka | .................. 438/682 |
| 6,624,095 B1 | * | 9/2003 | Yamamoto | .................. 438/795 |
| 7,179,729 B2 | * | 2/2007 | Dairiki et al. | ................ 438/535 |

FOREIGN PATENT DOCUMENTS

| | | | |
|---|---|---|---|
| JP | 03-089517 | * | 4/1991 |
| JP | 04-280625 | * | 10/1992 |
| JP | 11-204456 | * | 7/1999 |
| KR | 1020020041291 | | 6/2002 |

* cited by examiner

*Primary Examiner*—Kin-Chan Chen
(74) *Attorney, Agent, or Firm*—The Law Offices of Andrew D. Fortney; Andrew D. Fortney; Theresa J. Mahan

(57) ABSTRACT

Rapid thermal processing apparatus methods are disclosed. In a disclosed apparatus, rapid thermal processing is carried out when the residual oxygen detected by a residual oxygen detector does not exceed a predetermined tolerance level. Accordingly, it is possible to prevent the contact resistance of the wafers from increasing due to the presence of excessive oxygen.

21 Claims, 5 Drawing Sheets

RAPID THERMAL PROCESSING APPARATUS AND METHODS

FIELD OF THE DISCLOSURE

The present invention relates to semiconductor device fabrication and, in particular, to rapid thermal processing apparatus and methods capable of enhancing thermal processing stability.

BACKGROUND

Typically, a semiconductor device is fabricated with repetitive thermal treatments such as thermal oxidation, thermal diffusion, and various annealing processes. An annealing process is widely utilized for recovering the crystallinity after impurity ion injection, improving the contact characteristic of Al/Si and the interface characteristic of $Si/SiO_2$, sintering for forming silicide, etc.

The thermal treatment is carried out with a rapid thermal processing (RTP) apparatus together with a furnace. The RTP apparatus can achieve an expected high temperature and minimize harmful impurity diffusion in a short processing time (from a few seconds to a few minutes). Thus, the RTP apparatus is widely used in thermal treatment processes.

A conventional rapid thermal processing will be described hereinafter with reference to the accompanying drawings.

FIG. 1 is a cross-sectional view of a wafer which illustrates the shortcomings caused by a conventional thermal treatment process. FIG. 2 is a graph illustrating states of wafers processed by the conventional thermal treatment process.

Referring to the drawings, a wafer on which a transistor is held in a cassette. The illustrated transistor has a source, a drain, and a gate. A metal thin film is deposited on the transistor by means of sputtering.

The cassette holding the wafer is mounted on a support plate. The support plate separates a load lock chamber and a shuttle chamber.

Next, the load lock chamber is vacuumized by pumping out the oxygen by means of a pump installed inside an exhaust line of the load lock chamber. After the load lock chamber reaches a vacuum state, nitrogen is injected into the load lock chamber through a nitrogen injection line so as to keep the load lock chamber at a pressure higher than the atmospheric pressure.

While maintaining this pressure, a robot sequentially loads wafers, each of which is held in the cassette inside the load lock chamber, on a susceptor of the process chamber. The wafers are thermally treated in the nitrogen gas atmosphere.

Next, each thermally treated wafer is taken out of the process chamber, cooled on a cooling station (not shown) of the load lock chamber, and then held in the cassette. All of the wafers are thermal treated in this manner.

However, if over a predetermined level of oxygen remains inside the load lock chamber after the pumping out process for vacuumizing the load lock chamber, the remained oxygen may diffuse into the process chamber when a wafer is moved from the load lock chamber to the process chamber.

As shown in FIG. 1, if the thermal treating process is carried out to form a silicide in this oxygen-including environment, the thin metal film (110) is so oxidized as to form a metal oxide layer (120) since the thin metal film reacts with the oxygen at a much faster speed than it reacts with the silicon layer (130) at their interface. Further, the entire metal thin film can be oxidized and transformed into a dielectric layer.

Also, the oxidization of the thin metal film increases the contact moat resistance so as to cause malfunction of the device, thereby resulting in degradation of the reliability of the device.

The wafers, (i.e., the third to tenth wafers) loaded after oxygen is diffused inside the process chamber react as described above such that the surface of the thin metal film is oxidized, resulting in increase of the contact moat resistance. However, the wafers following the tenth wafer may have a normal contact moat resistance through the normal thermal treatment process since the diffused oxygen will have been consumed with the previous wafers. Also, as shown in FIG. 2, when the wafers held in the cassettes are sequentially thermally treated with the conventional technique, the first and second wafers can exhibit normal contact resistance since these wafers have been processed before the oxygen diffuses from the load lock chamber to the process chamber.

DETAILED DESCRIPTION

Example rapid thermal processing apparatus and methods will now be described in detail with reference to the accompanying drawings.

Figure 3:
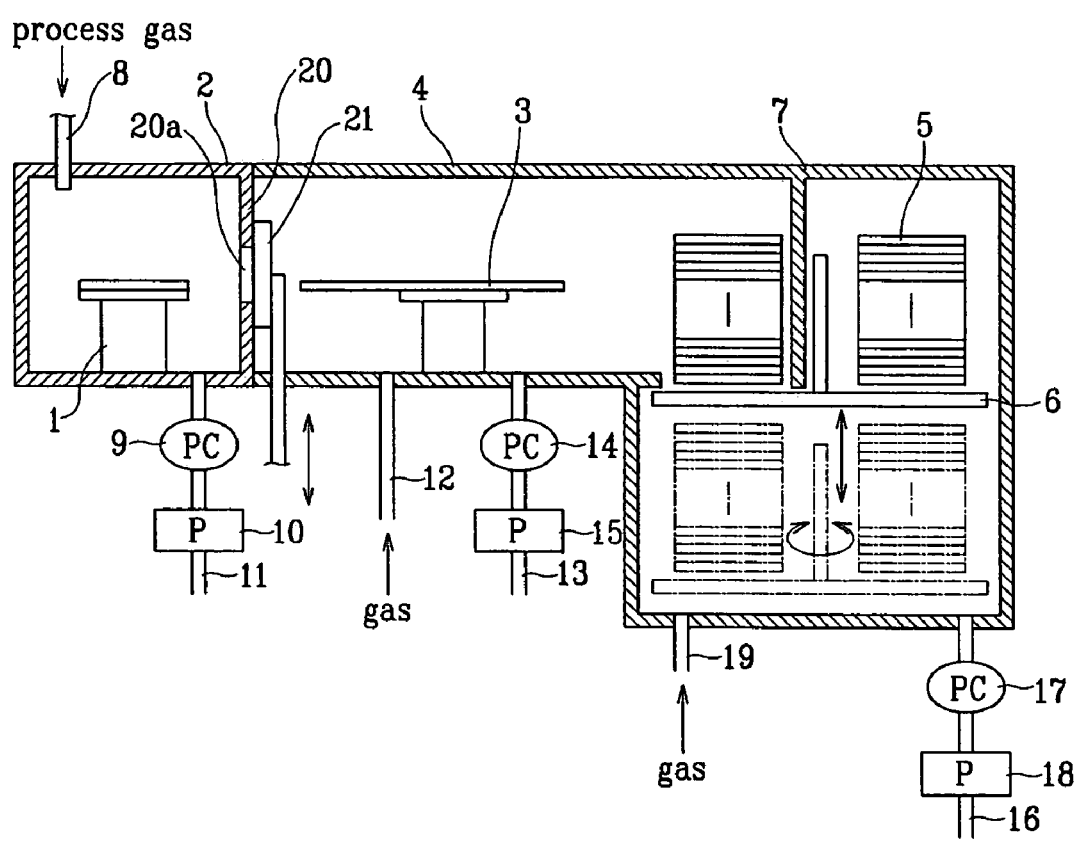
FIG. 3 is a cross-sectional view of an example rapid thermal procession apparatus.

FIG. 3 is a cross-sectional view of an example rapid thermal procession apparatus. The rapid thermal processing apparatus of FIG. 3 includes a process chamber 2 having a susceptor 1 for heating a wafer and performing thermal treating. It also has a load lock chamber 4 arranged at one side of the process chamber 2. A robot 3 is installed inside the load lock chamber 4. The illustrated rapid thermal processing apparatus also includes a shuttle chamber 7 arranged at one side of the load lock chamber 4. A support plate 6 is elevationally and rotatably installed inside the shuttle chamber. The support plate 6 supports a cassette 5 holding the wafers. The illustrated rapid thermal processing apparatus also includes a controller (not shown) for controlling the operations of the process chamber 2, the load lock chamber 4, and the shuttle chamber 7 of the rapid thermal process.

The upper side of the process chamber 2 is provided with a gas injection line 8 for injecting process gas into the process chamber 2. The process chamber 2 is coupled to a gas exhaustion line 11, a pressure adjustment valve 9 for adjusting the pressure inside the process chamber 2, and a pump 10 for pumping gas out of the chamber.

The load lock chamber 4 and the shuttle chamber 7 are respectively provided with gas injection lines 12 and 19 and gas exhaustion lines 13 and 16. Pumps 15 and 18 are coupled to the respective exhaust lines 13 and 16 for pumping gases out of the respective chambers. Pressure adjustment valves 14 and 17 are provided for adjusting the pressures inside the respective chambers.

A wall separating the process chamber 2 and the load lock chamber 4 is provided with a passage opening 20a which is closed and opened by means of a slit door 21.

At location(s) inside the process chamber 2 and/or the load lock chamber 4, one or more residual oxygen detectors (not shown) are installed for detecting the oxygen remained inside the respective chambers.

Figure 1:
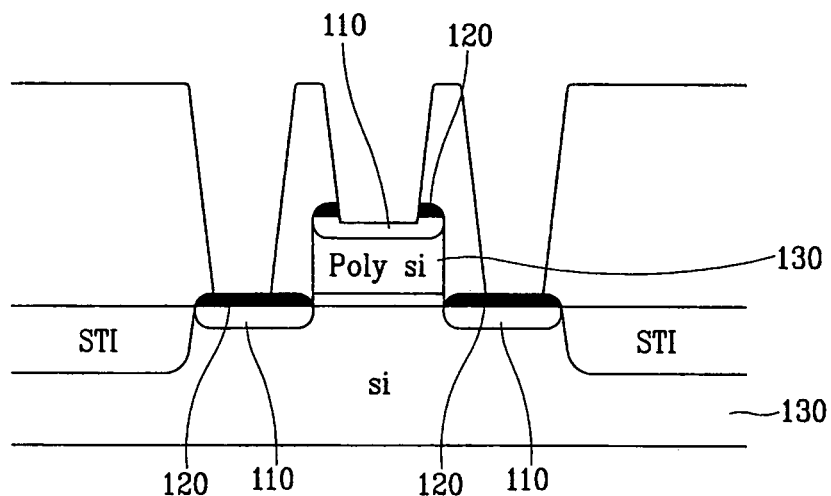
FIG. 1 is a cross-sectional view of a prior art wafer illustrating problems caused by a conventional thermal treatment process.
Figure 2:
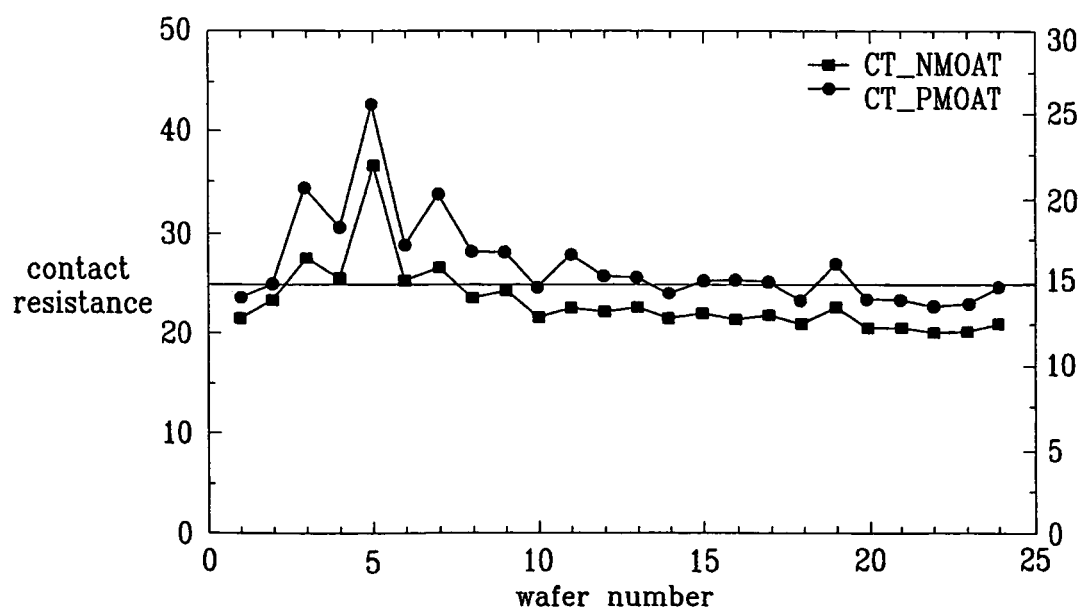
FIG. 2 is a graph of the contact resistance of wafers processed by the conventional thermal treatment process as a function of the wafer processing order.

The operation of the rapid thermal processing apparatus of FIG. 1 will now be described. The operation of the rapid thermal processing apparatus is controlled by the controller.

First, the cassette 5 holding the wafers to be thermal treated is loaded on the support plate 6. The shuttle chamber 7 and the load lock chamber 4 are controlled so that the pressures inside the chambers are substantially identical with each other. The load lock chamber 4 and the shuttle chamber 7 are then isolated from each other by the support plate 6.

After the chambers 4, 7 are isolated, the oxygen inside the load lock chamber 4 is exhausted by the pump 15 installed inside the exhausted line 13. Sequentially, the residual oxygen detector (not shown) detects the oxygen remained inside the load lock chamber 4 and checks that a level of the residual oxygen is lower than a predetermined one. If the residual oxygen level is below the predetermined level, nitrogen or argon gas is injected into the load lock chamber 4 through the gas injection line 12 until the pressure inside the load chamber reaches an appropriate level.

Next, the robot takes the wafers one by one from the cassette 5 in the load lock chamber 4 and loads the wafers onto the susceptor 1 of the process chamber 2. After loading the wafers, the thermal treatment process is carried out for a predetermined time while injecting the process gas through the gas injection line 8.

The residual oxygen detector (not shown) can be installed inside the process chamber 2. In this case, the amount of residual oxygen inside the process chamber 2 is detected when the slit door 21 is opened.

Next, the wafer is taken out from the process chamber 2 by the robot 3 and then is cooled on the cooling station (not shown) for a predetermined time.

In the meantime, if the amount of residual oxygen detected by the residual oxygen detector, is higher than a predetermined level, the pumping-out process is carried out again to exhaust the residual oxygen The pumping out process is preferably repeated until the residual oxygen level falls below the predetermined level. That is, in the rapid thermal processing apparatus of FIG. 3, a residual oxygen detector detects the amount of oxygen remaining in the process chamber 2 and/or the load lock chamber 4.

Figure 4:
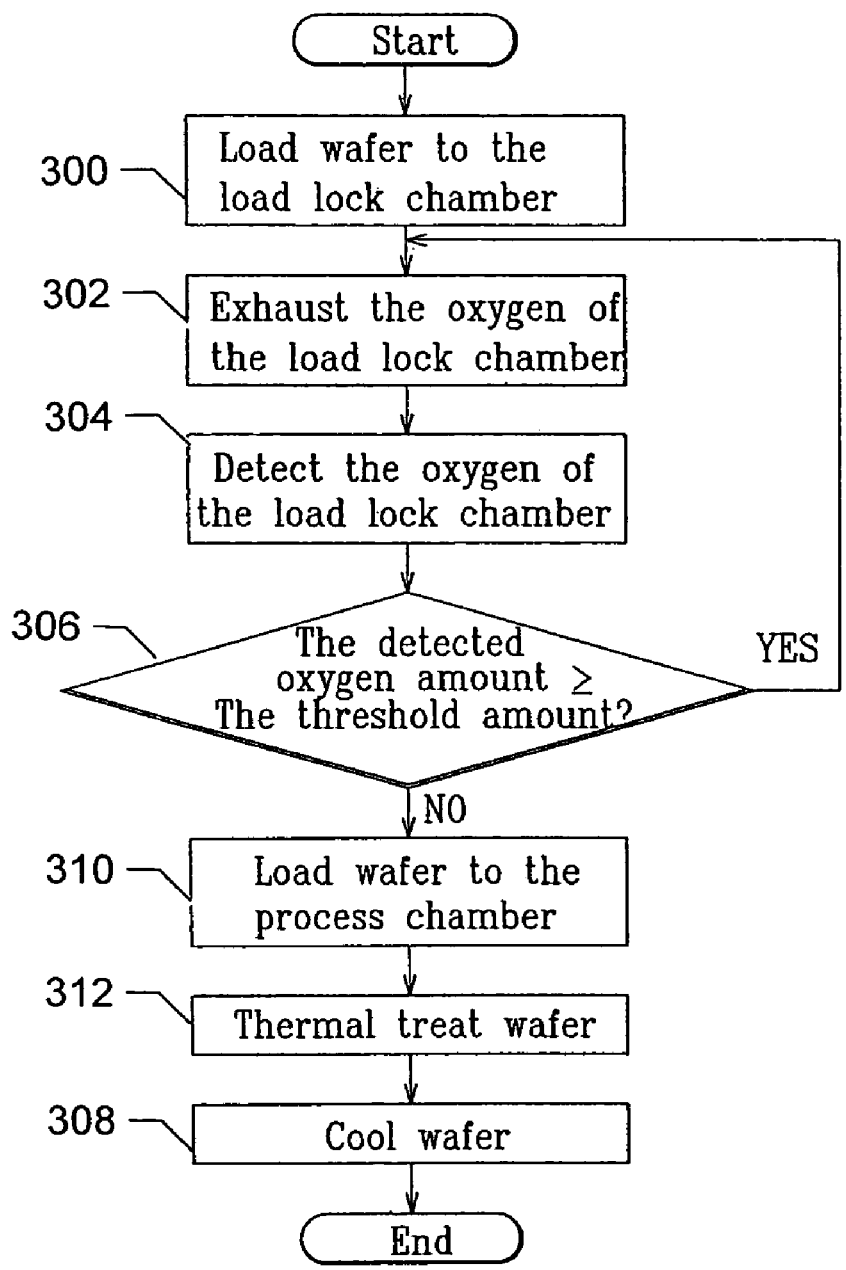
FIG. 4 is flowchart illustrating an example thermal processing method.

A method for thermally processing wafers using the rapid thermal processing apparatus of FIG. 1 will now be described. FIG. 4 is a flowchart illustrating a first example thermal processing method. FIG, 5 is a flowchart illustrating a second example thermal processing method. FIG. 3 is a graph of the contact resistance as a function of wafer processing order for wafers that are thermal treated by the thermal processing apparatus disclosed herein.

First, as shown in FIG. 4, wafers, (on which a transistor including a source, a drain, and a gate is formed and a metal thin film is deposited by means of sputtering), are held in the cassette 5.

Sequentially, the cassettes 5 holding wafers are loaded onto the support plate 6 (block 300). The load lock chamber 4 and the shuttle chamber 7 are then isolated from each other by the support plate 6.

Next, the pump 15 installed inside the exhaust line 13 of the load lock chamber 4 pumps out the oxygen existing inside the load lock chamber 4 (block 302). The residual oxygen detector (not shown) installed in the load lock chamber 4 detects the amount of the oxygen remaining inside the load lock chamber 4 (block 304).

Sequentially, the controller compares the detected oxygen amount with a threshold amount and injects nitrogen ($N_2$) or Argon (Ar) gas into the load lock chamber 4 through the gas injection line 12 (block 306). The pressure inside the load lock chamber 4 is adjusted by the pressure adjustment valve 14 so as to maintain the pressure inside the load lock chamber at an appropriate level, (i.e., a range of about 760~800 Torr). At this time, the base pressure of the load lock chamber is formed at a range of about 1~1000 mTorr and the back-fill-in pressure is formed at a range of about 1000~5000 mTorr.

If the detected oxygen amount is more than the threshold amount, the pump 15 continues to pump out the residual oxygen through the exhaust line 13 of the load lock chamber 4 (block 302).

The permissible amount of residual oxygen is preferably below 1.5 ppm. Preferably, the purity degree of the nitrogen or argon gas injected into the load lock chamber 4 is about 99.5%.

When the load lock chamber 4 reaches the vacuum state through these processes (block 306), the pressure inside the load lock chamber filled with the injected nitrogen or argon gas should be kept above atmospheric pressure.

Sequentially, while keeping the pressure higher than atmospheric pressure, the robot 3 removes the wafers held in the cassette 5 located in the load lock chamber and loads the wafers one by one onto the susceptor I of the process chamber 2 (block 308). The wafers are thermal treated for a predetermined time while injecting the process gas through the gas injection line 8 (block 310).

Then, the thermally treated wafers are taken from the process chamber 2, cooled on the cooling station (not shown) for a predetermined time, and re-placed into the cassette 5 one by one (block 312). All of the wafers are thermal treated and cooled in this manner.

Through these processes the surface of the metal thin film on the wafer can be prevented from being oxidized while a silicide layer is formed between the silicon layer and the metal thin film.

Figure 5:
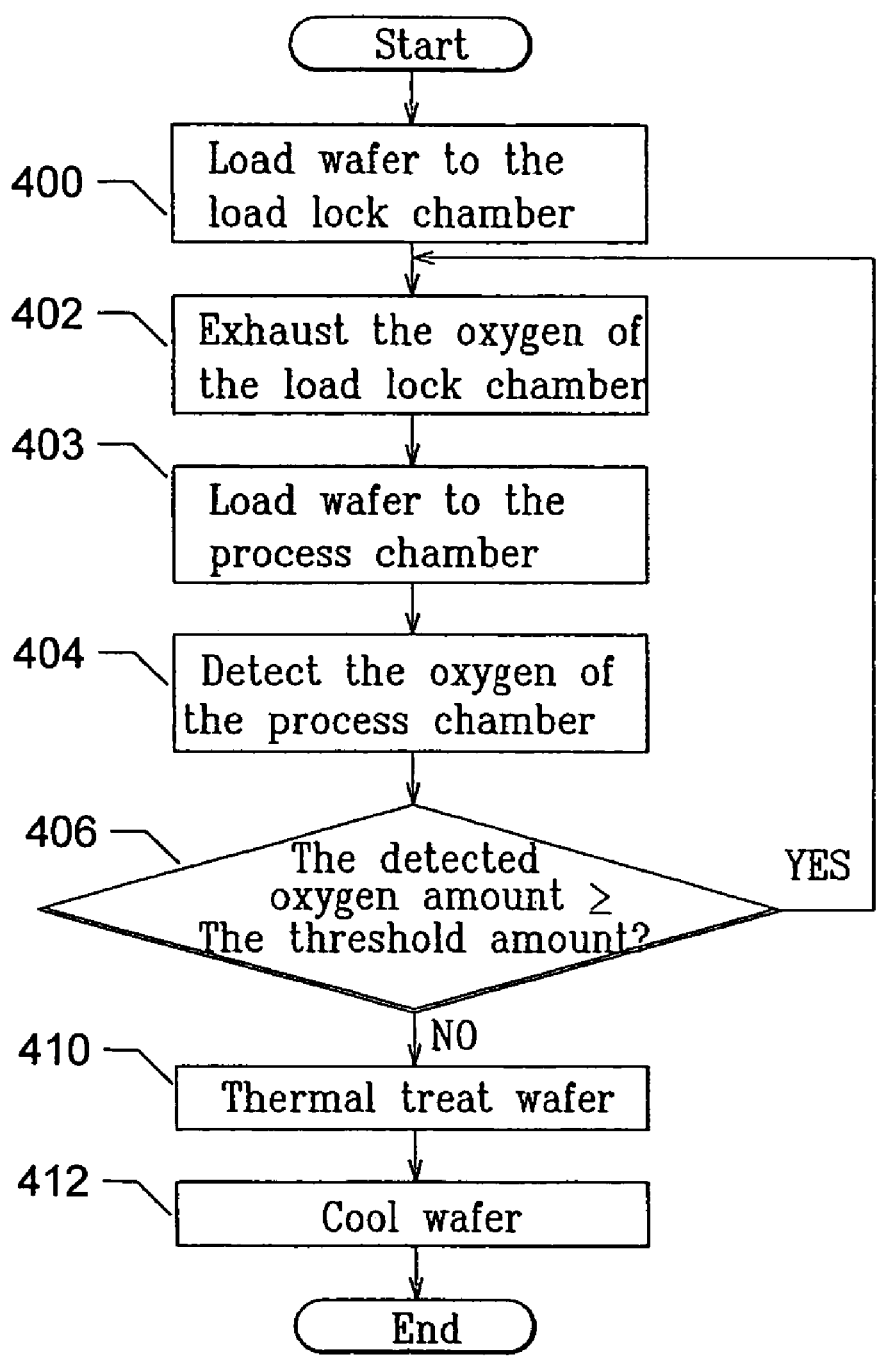
FIG. 5 is a flowchart illustrating a second thermal processing method.

An alternative method is shown in FIG. 5. As in the process of FIG. 4, in the process of FIG. 5, the wafers are held in cassettes 5. The cassettes 5 are sequentially loaded onto the support plate 6, which isolates the load lock chamber 4 and the shuttle chamber 7 from each other (block 400).

Next, the oxygen inside the load lock chamber 4 is exhausted by the pump 15 installed inside the exhausted line 13 and the nitrogen ($N_2$) or the argon (AR) gas is injected into the load lock chamber 4 through the gas injection line 12 until the pressure inside the load chamber reaches an appropriate level (block 402).

In order to move the wafers located in the load lock chamber 4 to the process chamber 2 (block 403), the slit door 21 is opened. At this time, the residual oxygen detector installed in the process chamber detects the amount of oxygen remaining in the process chamber 2.

Sequentially, the controller compares the detected oxygen amount with a threshold amount and injects the nitrogen ($N_2$) or argon (Ar) gas as the process gas into the load lock chamber 4 through the gas injection line 8 after loading the wafers on the susceptor 1 one by one (block 406). The wafers are thermal treated after the pressure inside the load lock chamber 4 being adjusted so as to be maintained at a range of about 760~800 ppm (block 410). On the other hand, if the detected oxygen amount is more than the threshold amount (block 406), the residual oxygen is pumped out again by the pump 15 installed inside the exhaust line 13 after closing the slit door 21 (block 402).

At this time, the permissible amount of residual oxygen is preferably below about 1.5 ppm. Preferably, the degree of purity of the nitrogen or argon gas injected into the load lock chamber 4 is about 99.5%.

After the wafers have been thermally treated (block 410), the thermally treated wafers are taken from the process chamber 2, cooled on the cooling station (not shown) for a predetermined time, and replaced in the cassette one by one (block 412). All of the wafers are thermally treated and cooled in this manner.

Through these processes the surface of the metal thin film on the wafer can be prevented from being oxidized while a silicide layer is formed between the silicon layer and the thin metal film.

Figure 6:
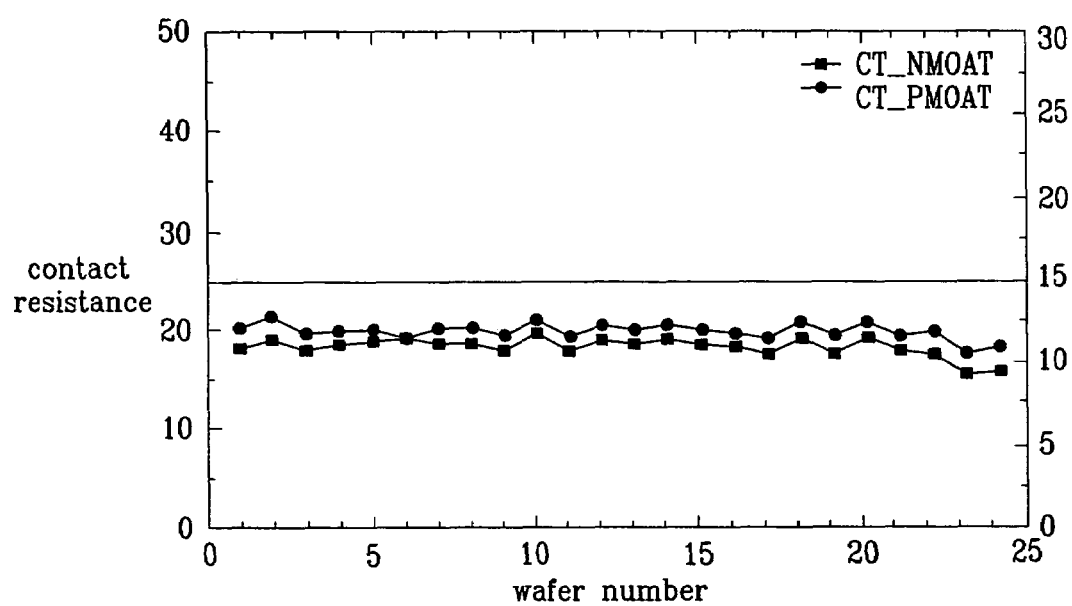
FIG. 6 is a graph of the contact resistance as a function of wafer processing order for wafers that are thermal treated through a thermal processing method disclosed herein.

521 By thermally treating all of the wafers held in the cassette 5, as shown in FIG. 6, since the amount of the oxygen diffused from the load lock chamber to the process chamber, (i.e., the oxygen remaining inside the process chamber) is below the predetermined amount, all of the wafers are normally thermally processed without being adversely effected by the oxygen. As a result, the wafers have stable contact moat resistance, which, in turn, results in improved reliability of the devices.

As described above, since the amount of residual oxygen inside the process chamber is checked before carrying out thermal processing, and the amount of residual oxygen is reduced if the residual oxygen amount exceeds a predetermined tolerance level, it is possible to prevent the contact resistance of the wafers from increasing due to the presence of excessive oxygen. Thus, improvements of the semiconductor device characteristics and reliability are achieved.

From the foregoing, persons of ordinary skill in the art will appreciate that the above disclosed methods and apparatus are capable of enhancing thermal processing reliability by preventing wafers from being oxidized by preventing thermal processing when oxygen has been diffused into the process chamber. Thus, the problems caused by oxygen and water vapor moving into the process chamber when wafers are moved from the process chamber to the load lock chamber (or vice versa) have been addressed.

An example rapid thermal processing apparatus disclosed herein comprises a process chamber 2 having a susceptor 1 for heating a wafer; a load lock chamber 4 arranged at one side of the process chamber 2 and having a robot 3 installed inside; a residual oxygen detector installed inside the load lock chamber 4 or the process chamber 2 for detecting residual oxygen; a controller comparing the amount detected by the residual oxygen detector with a predetermined threshold amount, the controller loading the wafer to the process chamber 2 to perform thermal processing when the detected oxygen amount does not exceed the threshold amount, and to remove oxygen from the load lock chamber 4 without moving the wafer to the process chamber 2 when the detected oxygen amount exceeds the threshold amount.

Also, an example thermal processing method disclosed herein comprises: loading a wafer into a load lock chamber 4; removing oxygen from inside the load lock chamber 4; detecting the oxygen remaining inside the load lock chamber 4 or inside a process chamber 2; determining whether or not the amount of residual oxygen exceeds a predetermined threshold amount; loading the wafer into the process chamber 2 when the residual oxygen amount does not exceed the predetermined threshold amount and removing oxygen from inside the load lock chamber 4 without moving the wafer to the process chamber 2 when the residual oxygen amount exceeds the predetermined threshold amount; thermally treating the wafer in the process chamber 2; and cooling the thermal treated wafer.

The residual oxygen amount inside the process chamber 2 can be the amount of oxygen detected in the process chamber 2 while the load lock chamber 4 and the process chamber 2 are opened for loading the wafer.

That is, since the amount of residual oxygen inside the process chamber 2 is checked before carrying out thermal processing and removed if the residual oxygen amount exceeds a predetermined tolerance level, it is possible to prevent the contact resistance of the wafers from increasing due to the presence of excessive oxygen, thereby resulting in improvements of the semiconductor device characteristic and reliability.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A rapid thermal processing method comprising:
   loading a wafer into a load lock chamber;
   removing oxygen inside the load lock chamber;
   detecting an amount of residual oxygen remaining in each of the load lock chamber and a rapid thermal processing chamber while the load lock chamber is open to the rapid thermal processing chamber;
   comparing the detected amount of residual oxygen to a predetermined threshold;
   loading the wafer onto a susceptor in the rapid thermal processing chamber if the amount of residual oxygen does not exceed the predetermined threshold, and removing at least some of the residual oxygen without moving the wafer to the rapid thermal processing chamber if the amount of residual oxygen exceeds the predetermined threshold;
   rapid thermal processing the wafer in the rapid thermal processing chamber; and
   cooling the rapid thermal processed wafer.

2. A rapid thermal processing method as defined in claim 1, wherein the predetermined threshold is less than or equal to about 1.5 ppm.

3. A rapid thermal processing method as defined in claim 1, further comprising injecting at least one of nitrogen and argon gas into the load lock chamber such that a pressure inside the load lock chamber reaches a range of about 760~800 Torr.

4. A rapid thermal processing method as defined in claim 3, wherein the wafer is thermally treated after injecting the at least one of the nitrogen and argon gas into the rapid thermal processing chamber such that a pressure inside of the rapid thermal processing chamber is at a range of about 760~800 Torr.

5. A rapid thermal processing method as defined in claim 3, wherein at least one of the nitrogen or argon gas injected into the load lock chamber has a purity degree of about 99.5%.

6. A rapid thermal processing method as defined in claim 3, further comprising keeping the pressure inside the load lock chamber above atmospheric pressure.

7. A rapid thermal processing method as defined in claim 3, comprising injecting nitrogen gas into the load lock chamber.

8. A rapid thermal processing method as defined in claim 3, comprising injecting argon gas into the load lock chamber.

9. A rapid thermal processing method as defined in claim 1, wherein a base pressure of the load lock chamber is in a range of about 1~1000 mTorr.

10. A rapid thermal processing method as defined in claim 1, wherein the predetermined threshold is less than or equal to about 1 ppm.

11. A rapid thermal processing method as defined in claim 1, wherein loading the wafer into the load lock chamber further comprises:
  loading a cassette holding wafers on a support plate in a shuttle chamber adjacent to the load lock chamber;
  lowering the cassette on the support plate;
  rotating the support plate; and
  raising the cassette on the support plate into the load lock chamber.

12. A rapid thermal processing method as defined in claim 11, further comprising isolating the load lock chamber and the shuttle chamber with the support plate.

13. A rapid thermal processing method as defined in claim 11, further comprising replacing the wafer into the cassette after cooling the wafer.

14. A rapid thermal processing method as defined in claim 1, further comprising removing the wafer from the rapid thermal processing chamber after rapid thermal processing the wafer.

15. A rapid thermal processing method as defined in claim 1, further comprising opening a slit door that isolates the load lock chamber and the rapid thermal processing chamber.

16. A rapid thermal processing method as defined in claim 1, further comprising injecting a process gas in the rapid thermal processing chamber through a gas injection line while rapid thermal processing the wafer.

17. A rapid thermal processing method as defined in claim 1, wherein the wafer contains exposed metal film thereon.

18. A rapid thermal processing method as defined in claim 1, wherein rapid thermal processing the wafer forms a metal silicide.

19. A rapid thermal processing method comprising:
  loading a wafer into a load lock chamber;
  removing oxygen inside the load lock chamber;
  detecting an amount of residual oxygen remaining in each of the load lock chamber and a rapid thermal processing chamber while the load lock chamber and the rapid thermal processing chamber are in communication for loading the wafer;
  comparing the detected amount of residual oxygen to a predetermined threshold;
  loading the wafer onto a susceptor in the rapid thermal processing chamber if the amount of residual oxygen does not exceed the predetermined threshold, and removing at least some of the residual oxygen without moving the wafer to the rapid thermal processing chamber if the amount of residual oxygen exceeds the predetermined threshold;
  rapid thermal processing the wafer in the rapid thermal processing chamber; and
  cooling the rapid thermal processed wafer.

20. A rapid thermal processing method as defined in claim 19, wherein the predetermined threshold is less than or equal to about 1.5 ppm.

21. A rapid thermal processing method as defined in claim 19, wherein
  loading the wafer into the load lock chamber further comprises:
  loading a cassette holding wafers on a support plate in a shuttle chamber adjacent to the load lock chamber;
  lowering the cassette on the support plate;
  rotating the support plate; and
  raising the cassette on the support plate into the load lock chamber.

* * * * *